United States Patent
Tomaru et al.

(10) Patent No.: US 7,016,196 B2
(45) Date of Patent: Mar. 21, 2006

(54) RADIATING STRUCTURAL BODY OF ELECTRONIC PART AND RADIATING SHEET USED FOR THE RADIATING STRUCTURAL BODY

(75) Inventors: Kazuhiko Tomaru, Gunma-ken (JP); Kunihiko Mita, Gunma-ken (JP); Tsutomu Yoneyama, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/250,686

(22) PCT Filed: Mar. 20, 2002

(86) PCT No.: PCT/JP02/02668

§ 371 (c)(1),
(2), (4) Date: Jul. 17, 2003

(87) PCT Pub. No.: WO02/084735

PCT Pub. Date: Oct. 24, 2002

(65) Prior Publication Data

US 2004/0057206 A1    Mar. 25, 2004

(30) Foreign Application Priority Data

Apr. 6, 2001 (JP) ............................. 2001-107972

(51) Int. Cl.
*H05K 7/20* (2006.01)
(52) U.S. Cl. .................. 361/702; 361/700; 361/704; 165/80.3; 257/707; 428/40.1; 428/40.4; 428/551; 524/404

(58) Field of Classification Search ........ 361/683–687, 361/690–697, 702–719; 174/16.3, 52.4, 174/138 G, 252; 257/666, 678, 687, 707–713, 257/718, 737; 165/80.2, 80.3, 80.4, 104.19, 165/84, 185; 156/89.24, 250, 247, 89.23, 156/346; 428/40.1, 40.4, 343, 118, 34.9, 428/209, 220, 551; 29/827–846, 855; 526/320, 526/328, 328.5; 524/404, 430, 443, 493, 524/496, 588

See application file for complete search history.

(56) References Cited

U.S. PATENT DOCUMENTS 4,230,753 A * 10/1980 Sheyon .................... 428/40.6

(Continued)

FOREIGN PATENT DOCUMENTS

EP    0 987 757    3/2000

(Continued)

OTHER PUBLICATIONS

U.S. Appl. No. 10/250,683, filed Jul. 17, 2003, Mita et al.

*Primary Examiner*—Michael Datskovskiy
(74) *Attorney, Agent, or Firm*—Oblon, Spivak, McClelland, Maier & Neustadt, P.C.

(57) ABSTRACT

A heat dissipating structure for a heat generating electronic component is characterized by comprising a heat dissipating sheet including a metal sheet and a heat conductive member having adhesion stacked thereon between the heat generating electronic component and a heat dissipating member, wherein the metal sheet is connected to the heat generating electronic component, and the heat conductive member having adhesion is connected to the heat dissipating member.

13 Claims, 1 Drawing Sheet

U.S. PATENT DOCUMENTS

| | | | | |
|---|---|---|---|---|
| 4,299,715 | A | * | 11/1981 | Whitfield et al. .............. 252/74 |
| 4,466,483 | A | * | 8/1984 | Whitfield et al. ........... 165/185 |
| 4,473,113 | A | * | 9/1984 | Whitfield et al. ........... 165/185 |
| 4,655,768 | A | * | 4/1987 | Marecki et al. ............. 424/448 |
| 4,728,572 | A | * | 3/1988 | Davis ................... 428/355 BL |
| 5,082,595 | A | * | 1/1992 | Glackin ....................... 252/511 |
| 5,162,410 | A | * | 11/1992 | Sweet ........................ 524/266 |
| 5,246,997 | A | * | 9/1993 | Sweet ........................ 524/266 |
| 5,352,722 | A | * | 10/1994 | Sweet et al. ................ 524/266 |
| 5,482,988 | A | * | 1/1996 | Ulman et al. ............... 524/266 |
| 5,504,136 | A | * | 4/1996 | Davis et al. ................ 524/490 |
| 5,545,473 | A | * | 8/1996 | Ameen et al. ............. 428/212 |
| 5,550,326 | A | | 8/1996 | Kesel |
| 5,590,066 | A | * | 12/1996 | Ohki .......................... 708/401 |
| 5,607,721 | A | * | 3/1997 | Ulman et al. ............ 427/208.4 |
| 5,658,975 | A | * | 8/1997 | Ulman et al. ............... 524/266 |
| 5,795,834 | A | * | 8/1998 | Deeb et al. ................... 442/62 |
| 5,798,171 | A | * | 8/1998 | Olson ......................... 428/220 |
| 5,861,211 | A | * | 1/1999 | Thakkar et al. ............. 428/343 |
| 5,876,855 | A | * | 3/1999 | Wong et al. .......... 428/355 BL |
| 5,904,796 | A | | 5/1999 | Freuler et al. |
| 5,930,893 | A | * | 8/1999 | Eaton ...................... 29/890.03 |
| 5,945,217 | A | * | 8/1999 | Hanrahan ................... 428/389 |
| 5,950,066 | A | * | 9/1999 | Hanson et al. .............. 428/551 |
| 6,046,907 | A | * | 4/2000 | Yamaguchi ................. 361/704 |
| 6,054,198 | A | * | 4/2000 | Bunyan et al. ............. 428/40.5 |
| 6,090,484 | A | * | 7/2000 | Bergerson ............. 428/355 EN |
| 6,165,612 | A | * | 12/2000 | Misra .......................... 428/344 |
| 6,183,855 | B1 | * | 2/2001 | Buckley ................... 428/317.9 |
| 6,197,859 | B1 | * | 3/2001 | Green et al. ................ 524/270 |
| 6,211,276 | B1 | | 4/2001 | Miyahara et al. |
| 6,227,458 | B1 | * | 5/2001 | Dever et al. .................. 239/36 |
| 6,228,965 | B1 | * | 5/2001 | Muta et al. .............. 526/328.5 |
| 6,255,376 | B1 | * | 7/2001 | Shikata et al. .............. 524/404 |
| 6,343,647 | B1 | * | 2/2002 | Kim et al. ................... 165/185 |
| 6,372,997 | B1 | * | 4/2002 | Hill et al. .................... 174/252 |
| 6,391,442 | B1 | * | 5/2002 | Duvall et al. ................ 428/348 |
| 6,399,209 | B1 | * | 6/2002 | Misra et al. ................. 428/447 |
| 6,433,057 | B1 | * | 8/2002 | Bhagwagar et al. ........ 524/403 |
| 6,451,422 | B1 | * | 9/2002 | Nguyen ....................... 428/323 |
| 6,530,915 | B1 | * | 3/2003 | Eppstein et al. ................ 606/2 |
| 6,616,999 | B1 | * | 9/2003 | Freuler et al. ............. 428/40.1 |
| 6,617,517 | B1 | * | 9/2003 | Hill et al. .................... 174/252 |
| 6,644,395 | B1 | * | 11/2003 | Bergin ........................ 165/185 |
| 6,652,705 | B1 | * | 11/2003 | Freuler et al. .............. 156/326 |
| 6,663,964 | B1 | * | 12/2003 | Mita et al. ................... 428/408 |
| 6,671,928 | B1 | * | 1/2004 | Huang .......................... 16/340 |
| 6,764,759 | B1 | * | 7/2004 | Duvall et al. ................ 428/348 |
| 2003/0152764 | A1 | * | 8/2003 | Bunyan et al. .............. 428/328 |

FOREIGN PATENT DOCUMENTS

| | | |
|---|---|---|
| JP | 10-247708 | 9/1998 |
| WO | 97/41599 | 11/1997 |

* cited by examiner

RADIATING STRUCTURAL BODY OF ELECTRONIC PART AND RADIATING SHEET USED FOR THE RADIATING STRUCTURAL BODY

TECHNICAL FIELD

This invention relates to a heat dissipating structure which can effectively conduct the heat generated by heat generating electronic components such as transistors and computer CPUs to heat dissipating members such as heat sinks, and a heat dissipating sheet used therein.

BACKGROUND ART

The recent drive for higher integration and operating speeds in CPUs, driver ICs, memories and other LSIs used in electronic equipment such as personal computers, digital video disks and mobile phones has increased the power consumption. Concomitantly the heat release has increased, which can cause malfunction of electronic equipment or damages to electronic components. It becomes very important to address the heat dissipation.

In prior art electronic equipment, heat sinks in the form of plates made of brass and other high thermal conductivity metals are used in order to suppress a temperature rise of electronic components during operation. The heat sinks conduct the heat generated by the electronic components and release the heat from their surface by means of a temperature difference from the ambient air.

For effective heat transfer from electronic components to heat sinks, the heat sink must be placed in intimate contact with the electronic component. Because of height differences among various electronic components and tolerance in the assembly process, a flexible heat conductive sheet or a heat conductive grease is interposed between the electronic component and the heat sink so that the heat transfer from the electronic component to the heat sink is established through the heat conductive sheet or heat conductive grease. The heat conductive sheet used is typically a heat conductive sheet made of heat conductive silicone rubber or the like (i.e., heat conductive silicone rubber sheet), and the heat conductive grease used is typically a heat conductive silicone grease.

The conventionally used heat conductive silicone rubber sheet, however, has a substantial contact thermal resistance at the interface with an electronic component, which imposes a certain limit to the heat transfer performance. This is a serious problem when electronic components of high-frequency drive with substantial heat generation such as CPUs are to be cooled. It is desired to reduce the interfacial contact thermal resistance.

On the other hand, heat conductive grease has a substantially negligible level of interfacial contact thermal resistance because of its liquid-like nature and exerts good heat transfer performance, but suffers from the problems that a special equipment such as dispenser is needed and its recovery entails an inefficient operation.

To overcome some of the above-described problems, a phase change heat dissipating sheet (simply phase change sheet) was proposed which is a solid sheet at normal room temperature, but softens by the heat generated by a electronic component during operation, to reduce the interfacial contact thermal resistance to a negligible level. The following phase change sheets were proposed in the prior art. U.S. Pat. No. 4,466,483 discloses a non-metallic sheet having phase change wax layers formed on opposite surfaces thereof. Also, U.S. Pat. No. 5,904,796 discloses a metal foil having a phase change paraffin or petroleum jelly formed on one surface thereof and an adhesive formed on the other surface thereof. JP-A 2000-509209 discloses a phase change sheet characterized by comprising an acrylic pressure-sensitive adhesive, a wax and a heat conductive filler, with an intermediate layer of network structure, film or the like being excluded.

On the other hand, the heat dissipating sheet is, on use, interposed between a heat dissipating member such as a heat sink and a heat generating electronic component such as CPU. In the recent industry, a situation has arisen where the process of producing personal computer components and the process of assembling such components to complete personal computers are separately performed at different locations over the world. It thus becomes a routine to attach a heat dissipating sheet to a heat sink at one location and transport the assembly to another location where it is mounted to CPU.

When the heat dissipating sheet-attached heat sink assembly is to be inspected for quality, the assembly must be mounted to a model CPU and subjected to a burn-in test or thermal cycling test under the same state as actual mounting. In the test, the phase change sheet works well because it melts at a temperature above the melting point and comes in close contact with the heat sink and the CPU. However, the phase change sheet can fail when the heat sink is separated from the CPU after the test. Even the electronic component and the heat sink can also fail because of strong adhesive bonds. In the event of failure of the phase change sheet, not only a new phase change sheet must be attached again, but a test must be done again to inspect whether the new phase change sheet meets the desired quality, which is unreasonable. After assembly to a personal computer, a burn-in test or thermal cycling test is sometimes done, giving rise to the same problem.

Moreover, U.S. Pat. No. 5,550,326 disclose a heat dissipator or heat dissipating structure in which an adhesive heat conductive pad layer is formed on one surface of a metal foil and which is used such that the surface of the adhesive heat conductive pad layer is in close contact with the electronic component side and the surface of the metal foil is in close contact with a heat dissipating member. This structure has the problem that since the adhesive heat conductive pad is in close contact with the electronic component, an attempt to peel the adhesive heat conductive pad from the electronic component can result in failure of the adhesive heat conductive pad and even failure of the electronic component.

The present invention intends to improve the above-discussed situation and its object is to provide a heat dissipating structure for a heat generating electronic component, which can effectively conduct the heat generated by the electronic component to a heat dissipating member such as a heat sink, and which even after a burn-in test or thermal cycling test to be performed for quality inspection, allows the electronic component and the heat dissipating member to be separated without structural failure of a heat dissipating sheet or failure of the electronic component, as well as a heat dissipating sheet used therein.

DISCLOSURE OF THE INVENTION

To attain the above object, the present invention provides a heat dissipating structure for a heat generating electronic component, characterized by comprising a heat dissipating sheet including a metal sheet and a heat conductive member having adhesion stacked thereon between the heat generating electronic component and a heat dissipating member, wherein the metal sheet is connected to the heat generating electronic component, and the heat conductive member having adhesion is connected to the heat dissipating member. The present invention also provides a heat dissipating sheet interposed between a heat generating electronic component and a heat dissipating member, characterized by comprising a metal sheet to be disposed on the side of the heat generating electronic component and a heat conductive member having adhesion stacked on the metal sheet and to be disposed on the side of the heat dissipating member, wherein the heat conductive member having adhesion is formed of a heat conductive composition comprising at least one resin component selected from among siloxane polymers, acrylic polymers and polyolefin polymers, and a heat conductive filler, the composition being able to phase change or soften by the heat from the electronic component during operation.

According to the invention, heat can be effectively conducted from the heat generating electronic component to the heat dissipating member, typically a heat sink. Even after a burn-in test or thermal cycling test, the electronic component or heat dissipating member can be removed from the heat dissipating sheet without inconvenient problems including structural failure of the heat dissipating sheet and failure of the electronic component.

BEST MODE FOR CARRYING OUT THE INVENTION

Figure 1:
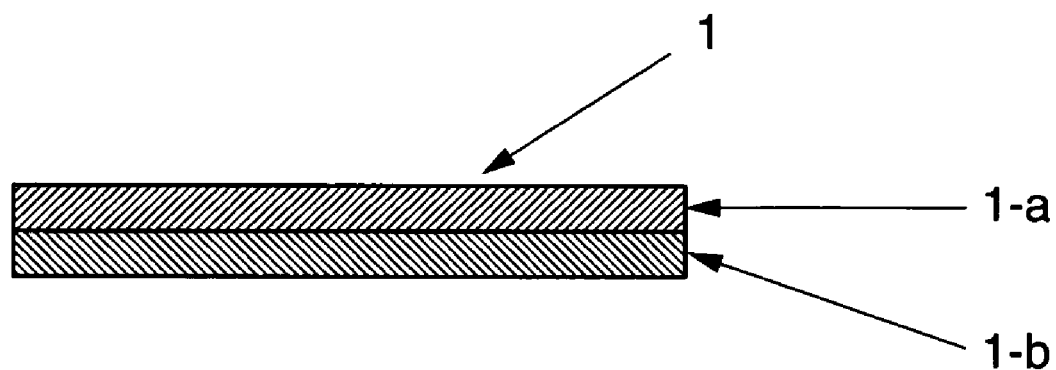
FIG. 1 is a cross-sectional view of a heat dissipating sheet according to one embodiment of the invention.

Now the present invention is described in further detail.

The heat dissipating sheet of the invention is to be interposed between a heat generating electronic component and a heat dissipating member and is characterized by comprising a metal sheet to be disposed on the side of the heat generating electronic component and a heat conductive member having adhesion stacked on the metal sheet and to be disposed on the side of the heat dissipating member, wherein the heat conductive member having adhesion is formed of a heat conductive composition comprising at least one resin component selected from among siloxane polymers, acrylic polymers and polyolefin polymers, and a heat conductive filler, the composition being able to phase change or soften by the heat from the electronic component during operation.

The preferred metal sheet used herein is an aluminum sheet, copper sheet, stainless steel sheet, tungsten sheet, gold sheet or the like, with the aluminum and copper sheets being more preferred for low cost. The metal sheet preferably has a thickness in the range of 3 to 200 $\mu$m, more preferably in the range of 5 to 75 $\mu$m. With a thickness of less than 3 $\mu$m, strength may be short. A thickness in excess of 200 $\mu$m may adversely affect the flexibility of the heat dissipating sheet, detracting from close contact with the electronic component.

The heat conductive member used herein may be formed of a clay-like heat conductive composition having pressure-sensitive adhesion, typical of which is an acrylic base pressure-sensitive adhesive, siloxane base pressure-sensitive adhesive or olefin base pressure-sensitive adhesive in which a heat conductive filler is compounded.

Preferably the clay-like heat conductive composition has a plasticity at 25° C. in the range of 100 to 1,000. With a plasticity of less than 100, the heat conductive member may have low strength and become less convenient to handle. With a plasticity of more than 1,000, the heat dissipating sheet may lack flexibility, giving rise to a problem to the close contact with the heat dissipating member.

In a preferred embodiment, the adhesive heat conductive member contains a phase transition material or thermosoftening material, because in response to heat generation of the electronic component during operation, the heat conductive member changes its phase from the solid to a liquid or fluid/semifluid or thermally softens for reducing the contact thermal resistance between it and the heat dissipating member. The phase transition or thermosoftening materials used herein include paraffin waxes, $\alpha$-olefins, silicone resins, and fluoro-resins. These phase transition or thermosoftening materials preferably have an endothermic peak associated with phase change or thermal softening as measured by a differential scanning calorimeter (DSC) in the range of 35 to 120° C., more preferably 40 to 100° C., especially the operating temperature range of electronic components of 50 to 80° C.

The heat conductive fillers used in the heat conductive member include metal powders such as iron, aluminum, nickel, silver, and gold, inorganic oxide powders such as silicon oxide, aluminum oxide, zinc oxide, iron oxide, and magnesium oxide, and inorganic nitride powders such as aluminum nitride and boron nitride. The heat conductive filler may have an average particle size in the range of 0.1 to 30 $\mu$m, with the maximum particle size being preferably up to 100 $\mu$m.

It is understood that the amount of the phase transition or thermosoftening material compounded and the amount of the heat conductive filler compounded in the acrylic, siloxane or olefin base pressure-sensitive adhesive may be determined as appropriate. Preferably the amount of phase transition or thermosoftening material is 10 to 1,000 parts by weight, especially 50 to 500 parts by weight per 100 parts by weight of the adhesive, and the amount of heat conductive filler is 0 to 3,000 parts by weight, especially 100 to 2,000 parts by weight per 100 parts by weight of the adhesive.

With respect to the thickness of the adhesive heat conductive member, a thinner member is advantageous because the thermal resistance becomes lower. However, it is substantially impossible to reduce the thickness below the maximum particle size of the heat conductive filler. Thus the thickness preferably ranges from a value equal to the maximum particle size of the heat conductive filler to an approximate 5 fold, and typically from 0.1 to 1,000 $\mu$m, especially from 1 to 500 $\mu$m.

The method of preparing the heat dissipating sheet comprising a metal sheet and a heat conductive member formed on one surface thereof is, for example, by dissolving the heat conductive composition in an organic solvent and applying the resulting slurry by any well-known coating or spraying technique. FIG. 1 illustrates the construction of the heat dissipating sheet of the invention. In FIG. 1, 1 denotes the heat dissipating sheet, 1-a denotes a heat conductive member, and 1-b denotes a metal sheet.

Figure 2:
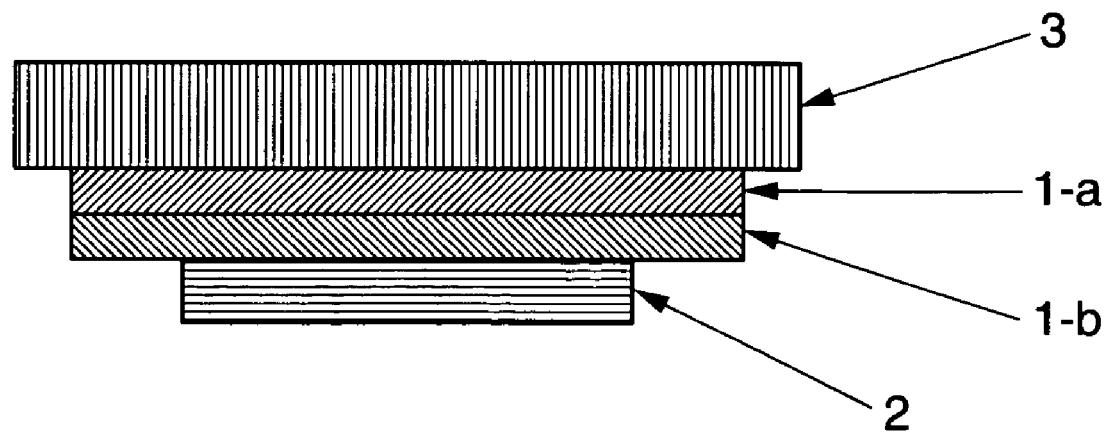
FIG. 2 is a cross-sectional view of a heat dissipating structure according to one embodiment of the invention.

In another aspect, the present invention provides a heat dissipating structure for a heat generating electronic component, comprising the above-described heat dissipating sheet including a metal sheet and an adhesive heat conductive member stacked thereon between the heat generating electronic component and a heat dissipating member, the metal sheet being connected to the heat generating electronic component, and the adhesive heat conductive member being connected to the heat dissipating member. As shown in FIG. 2, this structure is constructed as having a heat dissipating sheet 1 interposed between an electronic component 2 and a heat dissipating member 3. The heat conductive member 1-a is connected to the heat dissipating member 3, and the metal sheet 1b connected to the electronic component 2. With these connections, even after a burn-in test or thermal cycling test to be performed for quality inspection, the electronic component and the heat dissipating member can be removed without structural failure of the heat dissipating sheet. Since the heat conductive member in this heat dissipating structure has an adequate degree of pressure-sensitive adhesion, the heat dissipating sheet can be removed as being attached to the heat dissipating member. Moreover, since the adhesive heat conductive member is reinforced with the metal sheet, the heat dissipating sheet can be removed from the heat dissipating member without structural failure of the sheet, ensuring easy repair.

EXAMPLE

Examples are given below for illustrating the invention, but the invention is not limited to the examples.

Examples 1–6

20 parts by weight of xylene was added to 100 parts by weight of a heat conductive composition of the formulation shown in Table 1 to form a slurry, which was applied onto a metal sheet by means of a bar coater, and dried at 80° C. for 20 minutes, obtaining a heat dissipating sheet of 0.1 mm thick.

The heat dissipating sheet was measured for physical properties by the following measurement methods, with the results shown in Table 1.

It is seen from these results that the heat dissipating structure and heat dissipating sheet of the invention are very useful.

Measurement Methods

1) Plasticity Measurement:
   Measured by the plasticity test of JIS K-6249

2) Thermal Conductivity Measurement:
   Measured by a thermal conductivity meter QTM-500 (trade name, Kyoto Denki Co., Ltd.)

3) Thermal Resistance Measurement:
   A sample of 0.5 mm thick punched into a TO-3 transistor shape was interposed between a transistor 2SD923 (trade name, Fuji Electric Co., Ltd.) and a heat sink FBA-150-PS (trade name, OS Co., Ltd.), and a compression load of 1000 gf/cm$^2$ was applied. The heat sink was placed in a thermostat water tank and held at 60° C.
   Then a power of 10 V and 3 A was fed to the transistor. After 5 minutes, the temperature (T1) of the transistor and the temperature (T2) of the heat sink were measured using thermocouples embedded in the transistor and heat sink. The thermal resistance Rs (in ° C./W) of the sample was computed according to the equation: Rs=(T1−T2)/30.

4) Adhesive Strength Measurement:
   Measured by the adhesive tape test of JIS Z-0237

5) Thermosoftening Temperature:
   Measured from an endothermic peak by DSC

6) Repair:
   At the end of the above thermal resistance measurement, the transistor and the heat sink were separated apart. The heat dissipating sheet was rated OK (repairable) when it was kept connected to the heat sink side with its shape retained.

TABLE 1

| Compounding amount (pbw) | Example 1 | Example 2 | Example 3 | Example 4 | Example 5 | Example 6 |
|---|---|---|---|---|---|---|
| Acrylic adhesive | 100 | 0 | 0 | 50 | 0 | 0 |
| Silicone adhesive | 0 | 100 | 0 | 0 | 50 | 0 |
| Olefin adhesive | 0 | 0 | 100 | 0 | 0 | 50 |
| α-olefin | 0 | 0 | 0 | 0 | 0 | 50 |
| Paraffin wax | 0 | 0 | 0 | 50 | 0 | 0 |
| Silicone resin | 0 | 0 | 0 | 0 | 50 | 0 |
| Heat conductive filler 1 | 1400 | 1400 | 1400 | 0 | 0 | 0 |
| Heat conductive filler 2 | 0 | 0 | 0 | 800 | 800 | 800 |
| Metal sheet | Al foil 0.05 mm | Al foil 0.05 mm | Al foil 0.05 mm | Cu foil 0.018 mm | Cu foil 0.018 mm | Cu foil 0.018 mm |
| Thickness, mm | 0.1 | 0.1 | 0.1 | 0.1 | 0.1 | 0.1 |
| Thermal conductivity, W/mK | 3.2 | 3.1 | 3.0 | 4.1 | 4.0 | 3.9 |
| Thermal resistance, ° C./W | 0.06 | 0.06 | 0.07 | 0.03 | 0.03 | 0.03 |
| Thermosoftening temp., ° C. | — | — | — | 55 | 59 | 65 |
| Adhesive strength, N/cm | 0.60 | 0.45 | 0.17 | 0.13 | 0.15 | 0.10 |
| Plasticity | 300 | 310 | 400 | 500 | 600 | 700 |
| Repair | OK | OK | OK | OK | OK | OK |

Materials Used in Examples

Acrylic pressure-sensitive adhesive: SK-DYNE 1345 (trade name, Soken Chemical & Engineering Co., Ltd.)

Silicone pressure-sensitive adhesive: KR130 (trade name, Shin-Etsu Chemical Co., Ltd.)

Olefin pressure-sensitive adhesive: Lucant HC3000X (trade name, Mitsui Chemical Co., Ltd.)

α-olefin: DIALEN 30 (trade name, Mitsubishi Chemical Corp.)

Paraffin wax: 130 (trade name, Nippon Seiro Co., Ltd.)

Silicone resin: X-40-9800-59 (trade name, Shin-Etsu Chemical Co., Ltd.)

Heat conductive filler 1: alumina AO-41R (trade name, Admatechs Co., Ltd.)

Heat conductive filler 2: silver powder Ag-E-100 (trade name, Fukuda Metal Foil/Powder Industry Co., Ltd.)

Aluminum foil, copper foil: made by Fukuda Metal Foil/Powder Industry Co., Ltd.

The heat dissipating sheet for a heat generating electronic component according to the present invention can effectively conduct the heat generated by the electronic component to a heat dissipating member such as a heat sink, and even after a burn-in test or thermal cycling test to be performed for quality inspection, allows the electronic component and the heat dissipating member to be separated without structural failure of the heat dissipating sheet or failure of the electronic component.

The invention claimed is:

1. A heat dissipating structure for a heat generating electronic component, comprising a heat dissipating sheet including a metal sheet and a heat conductive member having adhesion, stacked on said metal sheet, between the heat generating electronic component and a heat dissipating member, wherein the metal sheet is connected to the heat generating electronic component, and the heat conductive member having adhesion is connected to the heat dissipating member, wherein said heat conductive member having adhesion is formed of a heat conductive composition comprising at least one resin component selected from the group consisting of pressure sensitive adhesive siloxane polymers, a heat conductive filler, and a phase transition material or thermosoftening material selected from the group consisting of silicone resins, the composition having a plasticity at 25° C. in the range of 100 to 1,000, as measured by JIS K-6249, and being able to phase change or soften by the heat from the electronic component during operation.

2. The heat dissipating structure of claim 1 wherein the metal sheet is an aluminum sheet or copper sheet.

3. A heat dissipating sheet adapted to be interposed between a heat generating electronic component and a heat dissipating member, comprising a metal sheet adapted to be disposed on the side of the heat generating electronic component and a heat conductive member having adhesion, stacked on the metal sheet and adapted to be disposed on the side of the heat dissipating member, wherein the heat conductive member having adhesion is formed of a heat conductive composition comprising at least one resin component selected from the group consisting of pressure sensitive adhesive siloxane polymers, a heat conductive filler, and a phase transition material or thermosoftening material selected from the group consisting of silicone resins, the composition having a plasticity at 25° C. in the range of 100 to 1,000, as measured by JIS K-6249, and being able to phase change or soften by the heat from the electronic component during operation.

4. The heat dissipating structure of claim 1, wherein the phase transition or thermosoftening material is present in an amount of 10 to 1,000 parts by weight, per 100 parts by weight of the resin component, and the heat conductive filler is present in an amount of 100 to 3,000 parts by weight, per 100 parts by weight of the resin component.

5. The heat dissipating structure of claim 1, wherein the phase transition or thermosoftening material is present in an amount of 50 to 500 parts by weight, per 100 parts by weight of the resin component, and the heat conductive filler is present in an amount of 100 to 2,000 parts by weight, per 100 parts by weight of the resin component.

6. The heat dissipating structure of claim 1, wherein the metal sheet has a thickness of 3 to 200 µm.

7. The heat dissipating structure of claim 1, wherein the metal sheet has a thickness of 5 to 75 µm.

8. The heat dissipating structure of claim 1, wherein the phase transition or thermosoftening material has an endothermic peak associated with phase change or thermosoftening as measured by a differential scanning calorimeter in the range of 35 to 120° C.

9. The heat dissipating structure of claim 8, wherein the phase transition or thermosoftening material has an endothermic peak associated with phase change or thermosoftening as measured by a differential scanning calorimeter in the range of 40 to 100° C.

10. The heat dissipating structure of claim 9, wherein the phase transition or thermosoftening material has an endothermic peak associated with phase change or thermosoftening as measured by a differential scanning calorimeter in the range of 50 to 80° C.

11. The heat dissipating structure of claim 1, wherein the heat conductive filler is present and has an average particle size in the range of 0.1 to 30 µm, and a maximum particle size of up to 100 µm.

12. The heat dissipating structure of claim 11, wherein the heat conductive member has a thickness ranging from a value equal to the maximum particle size of the heat conductive filler to an approximate 5 fold.

13. The heat dissipating structure of claim 1, wherein the heat conductive member has a thickness of from 0.1 to 1,000 µm.

* * * * *